US007877718B2

(12) United States Patent
Lin (10) Patent No.: US 7,877,718 B2
(45) Date of Patent: Jan. 25, 2011

(54) ANALOG IC PLACEMENT USING SYMMETRY-ISLANDS (75) Inventor: Po-Hung Lin, Zhubei (TW)

(73) Assignee: Springsoft USA, Inc., San Jose, CA (US)

( * ) Notice: Subject to any disclaimer, the term of this patent is extended or adjusted under 35 U.S.C. 154(b) by 591 days.

(21) Appl. No.: 11/930,992

(22) Filed: Oct. 31, 2007

(65) Prior Publication Data
US 2009/0113367 A1 Apr. 30, 2009

(51) Int. Cl.
G06F 17/50 (2006.01)
(52) U.S. Cl. ............................. 716/9; 716/10
(58) Field of Classification Search ........................ None
See application file for complete search history.

(56) References Cited

U.S. PATENT DOCUMENTS 6,550,046 B1   4/2003   Balasa et al.
7,093,220 B2   8/2006   Fallon et al.

OTHER PUBLICATIONS

Wu et al., "Rectilinenar Block Placement Using B*-Trees," ACM Transactions on Design Automation of Electronic Systems, vol. 8, No. 2, Apr. 2003, pp. 188-202.*
Tam et al., "Analog Placement with Symmetry and Other Placement Constraints," ICCAS '06, 2006 ACM, pp. 349-354.*
Prieto et al., "A Performance-Driven Placement Algorithm with Simultaneous Place&Route Optimization for Analog ICs," 1997 IEEE, pp. 389-394.*
Maruvada et al., "Placement with Symmetry Constraints for Analog Layout Using Red-Black Trees," 2003 IEEE, pp. 489-492.*
Kouda et al., "Improved Method of Cell Placement with Symmetry Constraints for Analog IC Layout Design," ISPD'06, 2006 ACM, pp. 192-199.*
Lin et al., "Module placement with boundary constraints using B*-trees," IEE Proc.—Circuits Devices Syst., vol. 149, No. 4, Aug. 2002, pp. 251-256.*
Lin et al., "Placement with Symmetry Constraints for Analog Layout Design Using TCG-S," ASP-DAC 2005, IEEE, pp. 1135-1138.*
Lampaert et al., "A Performance-Driven Placement Tool for Analog Integrated Circuits," IEEE Journal of Solid-State Circuits, vol. 30, No. 7, Jul. 1995, pp. 773-780.*
Lin et al., "LAKE : A Performance-Driven Analog CMOS Cell Layout Generator," 1994 IEEE, pp. 564-569.*

(Continued)

Primary Examiner—Leigh Marie Garbowski
(74) Attorney, Agent, or Firm—Chernoff, Vilhauer, McClung & Stenzel (57) ABSTRACT A placement tool searches for an optimal placement for a plurality of device modules within an integrated circuit (IC) including symmetry groups formed by device modules that are to be symmetrically placed. The tool employs a hierarchical B*-tree (HB*-tree) representation of a trial placement wherein each symmetry group and each module not included in a symmetry group is represented by a separate node of the HB*-tree. Each symmetry group node maps to a symmetry island placement for the symmetry group satisfying all symmetry and other placement constraints on the symmetry group. The placement tool employs a simulated annealing technique to iteratively perturb the HB*-tree representation to produce a sequence of trial placements, and uses a cost function to evaluate the quality of each trial placement.

17 Claims, 8 Drawing Sheets

OTHER PUBLICATIONS

Krishnamoorthy et al., "Fast Evaluation of Symmetric-Feasible Sequence-Pairs for Analog Topological Placement," 2003 IEEE, pp. 71-74.*

Balasa, "Modeling Non-Slicing Floorplans with Binary Trees," 2000 IEEE, pp. 13-16.*

Balasa, "Device-Level Placement for Analog Layout: An Opportunity for Non-Slicing Topological Representations," 2001 IEEE, pp. 281-286.*

Balasa et al., "On the Exporation of the Solution Space in Analog Placement with SYmmetry Constraints," IEEE Trans. on CAD of ICs and Systems, vol. 23, No. 2, Feb. 2004, pp. 177-191.*

Balasa et al., "Efficient Solution Space Exploration Based on Segment Trees in Analog Placement with Symmetry Constraints," 2002 IEEE, pp. 497-502.*

Lin et al., "Analog Placement Based on Novel Symmetry-Island Formulation," DAC '07, pp. 465-470.*

Chang et al, "B*-Trees: A New Representation for Non-Slicing Floorplans," Department of Computer and Information Science, National Chiao Tung University, Hsinchu 300, Taiwan, 2000, 6 pages.

* cited by examiner

ANALOG IC PLACEMENT USING SYMMETRY-ISLANDS

BACKGROUND OF THE INVENTION

1. Field of the Invention

The invention relates in general to a system for determining positions for modules within an analog integrated circuit (IC) and in particular for a system for positioning modules within an IC containing symmetric circuits.

2. Description of Related Art

A netlist describes an analog IC as including a set of interconnected device modules such as transistors, capacitors, resistors and other devices. A computer-based placement tool processes a netlist to determine a suitable position and orientation within the IC for each device module. To reduce the effect of parasitic mismatches and circuit sensitivity to thermal gradients or process variations, a placement tool will try to place pairs of matching modules close to one another and symmetrically with respect to one another with respect to a common axis. The circuit designer will normally provide the placement tool with a set of symmetry constraints identifying each group of modules (a "symmetry group") that is to have a symmetric layout, identifying each pair of matching devices (a "symmetry pair") within each symmetry group that is to be placed symmetrically about an axis of the symmetry group, and identifying each internally symmetric module (a "self-symmetry module") within the group that is to be centered on the symmetry group axis.

When generating a placement plan, a placement tool typically treats each module of an IC as a rectangle that is large enough to accommodate the device module and to provide some additional space around the device module for routing the conductors ("nets") that are to interconnect device modules. The problem of selecting a position for each module of the IC becomes one of finding a non-overlapping position within a plane for each of a set of rectangles of various sizes and shapes in a way that satisfies various symmetry and other constraints on device module placement.

Figures 1A, 1B, 1C, 2A, 2B, 3:
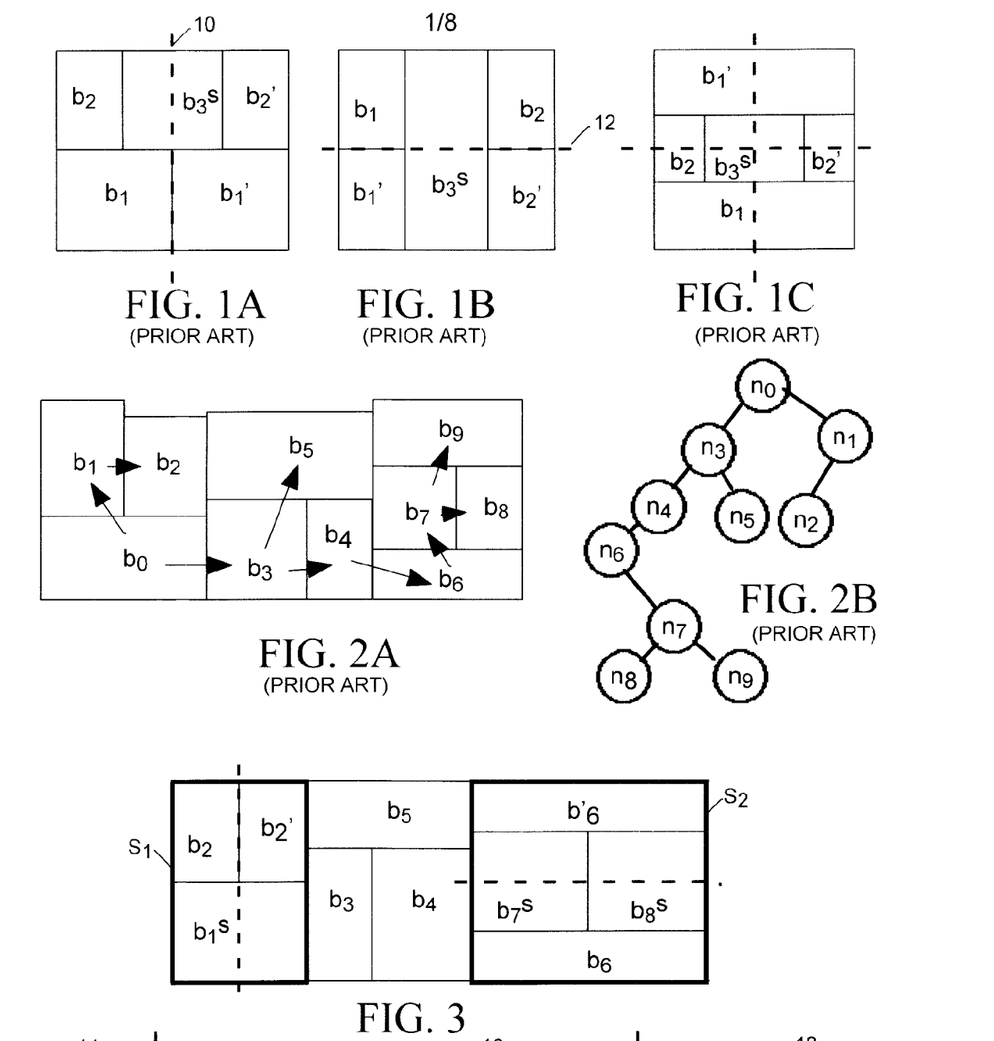
FIGS. 1A-1C illustrate IC placements for device groups exhibiting one-dimensional vertical, one-dimensional horizontal, and two-dimensional symmetry, respectively.
FIG. 2A illustrates an IC placement. for a collection of modules.
FIG. 2B illustrate a B*-tree representation of the IC placement of FIG. 2A.
FIG. 3 illustrates an IC placement including two symmetry groups.

FIG. 1A shows a placement for a symmetry group that is symmetric about a vertical axis 10 and FIG. 1B shows a placement for a symmetry group that is symmetric about a horizontal axis 12. The following notation is used in FIGS. 1A and 1B and elsewhere in this specification.

| | |
|---|---|
| S | a symmetry group |
| $b_i$ | a module |
| $(b_j, b_{j'})$ | a symmetry pair |
| $b_i^s$ | a self-symmetry module |

The following expression can represent the symmetry group S of FIG. 1A:

$$S=((b_1, b_1'), (b_2, b_2'), b_3^s)$$

A placement plan for an analog IC must satisfy other constraints in addition to symmetry constraints including, for example, constraints on available space and constraints on positions and orientations of certain modules. Although many different IC placements may satisfy all constraints, designers consider some placements to be better than others based on a number of factors. For example, designers usually consider a placement that positions highly interconnected modules near one another to be better because it reduces the lengths of the net needed to interconnect module terminals, thereby making it more likely that a computer-based routing tool will be able to route the nets between modules positioned in accordance with the placement plan. A more compact placement may be considered better when it can result in a smaller or faster IC. Placement tools commonly generate several different trial placements and evaluate each trial placement based on a "cost function" having a value that is a weighted sum of various attributes of the trial placement such as variables representing estimated lengths of the nets ("wire lengths"), the total placement area and other factors. The trial placement having the lowest cost function value is selected as the most suitable placement.

One way to generate a large number of trial placements is to start with an initial placement and then iteratively perturb the initial placement by changing positions and orientations of the device modules to produce many trial placements, and to evaluate a cost function for each trial placement to find a best placement. Much prior work in this area has been directed toward developing approaches for reducing the amount of processing time needed to arrive at a low cost placement solution while satisfying the symmetry constraints.

One way to reduce processing time is to represent a trial placement in a way that allows a placement tool to quickly and easily perturb a trial placement to produce a different placement. While it is possible for a placement tool to employ a topological representation of a trial placement that directly tracks the coordinates of each rectangle within an IC layout, it is difficult and time-consuming for a placement tool to iteratively perturb such a topological representation of a trial placement in order to create other trial placements because a change to coordinates of any one rectangle can have a ripple effect on coordinates of every other rectangle. The article, "B*-Trees: A New Representation For Non-slicing Floorplans," Proc. DAC, pp. 458-463, 2000, describes a placement method employing a binary tree ("B*-tree") to represent a compacted placement in which no module can move any further down or to the left. A B*-tree is a convenient way for a placement tool to represent a placement because it is relatively easy for the tool to alter a placement by altering the B*tree representation. FIG. 2A shows a compacted placement of a set of 10 modules $b_0$-$b_9$ and FIG. 2B shows a corresponding B*-tree representation of that placement wherein every node $n_i$ of the B*-tree corresponds to a module $b_i$ of the compacted placement. The root $n_0$ of the B*-tree of FIG. 2B corresponds to the module $b_0$ on the bottom-left corner of the placement of FIG. 2A. For each node $n_i$ corresponding to a module $b_i$, the left child of node $n_i$ represents the lowest, adjacent module on the right side of module big while the right child of node $n_i$ represents the first module above $b_i$ having the same horizontal coordinate. The width and height dimensions $(w_i, h_i)$ of the rectangular device module $b_i$ associated with each node god can be stored in a database.

Given a B*-tree representation of a compacted placement, a placement tool can, when necessary, calculate the coordinate $(x_i, y_i)$ of each module through an ordered tree traversal. Suppose the module $b_i$, represented by the node $n_i$, has the bottom-left coordinate $(x_i, y_i)$, width $w_i$, and height $h_i$. Then for the left child, $n_j$, of $n_i$, $x_j=x_i+w_i$; for the right child, $n_k$, of $n_i$, $x_k=x_i$. A placement tool in accordance with the invention maintains a contour structure to calculate y-coordinates. Thus, starting from the root node, whose bottom-left coordinate is (0, 0), then visiting the root's left subtree, and then its right subtree, the tool can use a pre-order tree traversal procedure (B*-tree packing) to calculate all coordinates of the modules in the placement.

A B*-tree is a convenient way for a placement tool to represent a compacted trial placement that allows it to quickly perturb a trial placement by modifying its B*-tree representation and to quickly determine whether the placement satisfies some kinds of constraints by processing its B*-tree representation. For example it is possible to determine from a B*-tree representation whether a set of modules forming a symmetry group will satisfy symmetry constraints on the symmetry group. Once a placement tool has generated a B*-tree representation of a new trial placement and has processed the B*-tree representation to determine whether the trial placement it specifies will satisfy various symmetry and other constraints, the placement tool can quickly convert the B*-tree representation of the trial placement into physical locations that will enable it to conveniently determine whether the trial placement satisfies other constraints and to evaluate the cost function for that particular trial placement. However, a placement tool employing B*-tree placement representations can still require substantial amounts of processing time to find an optimal placement particularly for large analog ICs that include several symmetry groups because the solution space that must be searched can still be quite large.

U.S. Pat. No. 6,550,046, issued Apr. 15, 2003 to Balasa et al describes an automated method for packing cells in an analog IC layout including symmetry groups that are subject to symmetry constraints. Symmetry constraints are defined for each symmetry group, which are represented by sequence-pairs. To reduce the solution space, the initial sequence pair encoding is required to be symmetry-feasible so that the search subspace is therefore limited to symmetry-feasible sequence-pairs. Nevertheless, the solution space is also quite large because the sequence-pair representation does not preclude the devices in symmetry groups from being placed far apart, which will not be considered a good placement.

What is needed is an approach to analog IC placement that limits the search space to trial placements wherein device modules forming each symmetry group reside near one another and wherein each symmetry group satisfies all symmetry constraints.

SUMMARY OF THE INVENTION

The invention relates to a method for selecting a suitable placement for a set of device modules within an integrated circuit (IC) including at least one symmetry group formed by device modules that are symmetrically placed about at least one axis of an area of the IC occupied by the symmetry group. The invention may be implemented in the form of software residing on computer-readable media which when read and executed by a conventional computer, causes it to execute the method.

A placement tool implementing the method in accordance with the invention iteratively perturbs a representation of a trial placement for the device modules to produce a set of differing trial placement representations. Each trial placement representation comprises a separate element representing each symmetry group and each device module not forming any symmetry group.

The placement tool separately evaluates a cost function that is a measure of placement quality for each of the trial placements; and selects one of the trial placements as the suitable placement in accordance with the cost function evaluations.

Each trial placement representation is suitably in the form of a hierarchical B*-tree ("HB*-tree") wherein each node of the tree corresponds to either a symmetry group or to a device module not included in any symmetry group. Each symmetry group node represents an automatically symmetric-feasible B*-tree (ASF-B*-tree) that maps the corresponding symmetry group to a symmetry island within the trial placement. Each device module of a symmetry island abuts at least one other device module of the symmetry island to form a connected placement that satisfies all symmetry constraints on the corresponding symmetry group requiring it to be symmetric with respect to one or two axes of the area occupied by the symmetry island.

Whenever the placement tool perturbs the trial placement representation, it may alter a node of the HB*-tree to rotate or reposition a device, to swap positions of two nodes in the HB*-tree, to alter an ASF-B*-tree representation of a symmetry island to change the layout of the symmetry island within the trial placement.

The invention is advantageous because use of the HB*-tree placement representations to depict symmetry groups as symmetry-islands insures that a placement tool need only generate and evaluate trial placements in which all symmetry groups satisfy symmetric placement constraints and in which all modules within each symmetry group are positioned close to one another, thereby limiting the solution space the tool must investigate when searching for an optimal placement solution.

DETAILED DESCRIPTION OF THE INVENTION

The invention relates to a method implemented by a tool for placing modules within an integrated circuit (IC) layout. The invention can be implemented in the form of computer-readable media containing software which, when read and executed by a conventional computer, causes the computer to act as a placement tool carrying out the method in accordance with the invention. Suitable computer-readable media includes, but is not limited to, random access and read only memory, hard drives, compact disks and floppy disks. While a preferred embodiment of the invention described below incorporates the essential features of the invention, not all features of the preferred embodiment may be essential to the invention, and those of skill in the art will appreciate that other embodiments of the invention defined by the claims attached to this specification are possible.

A placement tool in accordance with the invention searches for an optimal placement for a plurality of device modules within an integrated circuit (IC) including symmetry groups formed by device modules that are to be symmetrically placed about one or more axes of an area occupied by the symmetry group. As discussed below, the placement tool employs a hierarchical B*-tree (HB*-tree) representation of a trial placement wherein each symmetry group and each module not included in a symmetry group is represented by a separate node of the HB*-tree. Each symmetry group node maps to a "symmetry island" placement for the symmetry group wherein the modules forming the symmetry group reside near one another and are positioned to satisfy all symmetry and other placement constraints on the symmetry group. The placement tool employs a simulated annealing technique to iteratively perturb the HB*-tree representation to produce a sequence of trial placements, and uses a cost function to evaluate the quality of each trial placement.

Symmetry Islands

An analog IC layout design can include one or more sets of devices, each exhibiting any of three symmetry types: one-dimensional ("1D") vertical symmetry, 1D horizontal symmetry, and two-dimensional ("2D") symmetry as illustrated by FIGS. 1A and 1C, respectively. A "symmetry group" is a set of modules that are subject to a symmetry constraint requiring them to be placed in accordance one of the three symmetry types. A "symmetry-pair" is two modules of similar dimension and orientation included within a symmetry group that should be placed symmetrically with respect to a central horizontal or vertical axis of the symmetry group. Pairs $(b_i, b_1')$ and $(b_2, b_2')$ of FIGS. 1A-1C are symmetry pairs. A "symmetry group" $S_i = \{(b_1, b_1'), (b_2, b_2'), \ldots, (b_p, b_p'), b^s_1, b^s_2, \ldots, b^s_q\}$ consists of p symmetry pairs and q self-symmetry modules. A "symmetry pair" comprises two similar modules that are to be placed symmetrically with respect to the central horizontal and/or vertical axes of an area occupied by the symmetry group containing the symmetry pair, with one module being the mirror image of the other. A "self-symmetry module" is an internally symmetric module that should have its center on the central horizontal and/or vertical symmetry axis of the area occupied by its symmetry group.

TABLE I

| | |
|---|---|
| $b_l$ | a module that may be included in an IC |
| $S_l$ | a symmetry group |
| $(b_i, b_i')$ | a symmetry pair |
| $b_l^s$ | a self-symmetry module. |
| $b^r$ | either a symmetry pair or self-symmetry module |
| $n_l$ | a node in a B*-tree |
| $(x_j, y_j)$ | a center coordinate of module $b_j$ |
| $(w_j, h_j)$ | the width and height of module $b_j$ |
| $(\hat{x}_i, \hat{y}_i)$ | coordinates of the horizontal and/or vertical symmetry axis of symmetry group $S_l$. |

Pairs $(b_1, b_1')$ and $(b_2, b_2')$ of FIGS. 1A-1C are symmetry pairs. Modules $b^s_3$ of FIGS. 1A-1C are self-symmetry modules. Let $S = \{S_1, S_1, \ldots, S_n\}$ be a set of n symmetry groups within an IC layout each of whose symmetry axis coordinates are $\hat{x}_i, \hat{y}_i$. A "symmetry group" $S_i = \{(b_1, b_1'), (b_2, b_2'), \ldots, (b_p, b_p'), b^s_1, b^s_2, \ldots, b^s_q\}$ consists of p symmetry pairs and q self-symmetry modules. A "symmetry pair" comprises two similar modules that are to be placed symmetrically with respect to the central horizontal and/or vertical axes of the symmetry group containing the symmetry pair, with one module being the mirror image of the other. A "self-symmetry module" is an internally symmetric module that should have its center on the central horizontal and/or vertical symmetry axis of its symmetry group. Let $(x_j, y_j)$ and $(x_i', y_i')$ denote the respective coordinates of the centers of two modules $b_j$ and $b_j'$ in a symmetry pair $(b_i, b_i')$, and $(x^s_k, y^s_k)$ denotes coordinates of the center of the self-symmetry module $b^s_k$. The symmetric placement of a symmetry group $S_i$ with 1D vertical (horizontal) symmetry must satisfy the three equations in Group (1) (Group (2)) listed in Table II, while placement of a symmetry group with 2D symmetry must satisfy either the four equations in Group (3) or the four equations in Group (4).

TABLE II

| (1) | (2) | (3) | (4) |
|---|---|---|---|
| $2\hat{x}_i = x_j + x_j'$ | $x_j = x_j'$ | $2\hat{x}_i = x_j + x_j'$ | $x_j = x_j'$ |
| $y_j = y_j$ | $2\hat{y}_i = y_j + y_j'$ | $\hat{y}_j = y_j = y_j'$ | $2\hat{y}_i = y_j + y_j$ |
| $\hat{x}_i = x_k^s$ | $y_i = y_k^s$ | $\hat{x}_i = x_k^s$ | $\hat{x}_i = x_k^s$ |
| | | $\hat{y}_i = y_k^s$ | $\hat{y}_i = y_k^s$ |

FIG. 3 shows a symmetric placement example of ten modules, including two symmetry groups $S_1$ and $S_2$, where $S_1 = \{b^s_1, (b_2, b_2')\}$ in 1D vertical symmetry, and $S_2 = \{(b_6, b_6'), b^s_7, b^s_8\}$ in 1D horizontal symmetry.

Figure 4:
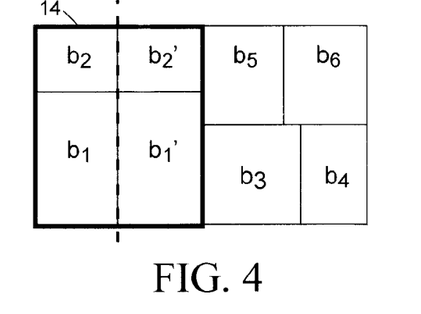
FIGS. 4 and 5 illustrate alternative versions of an IC placement including a symmetry group.
Figure 5:
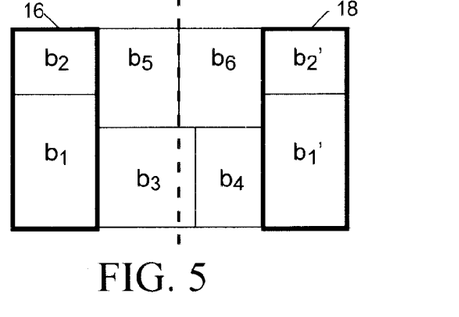

To reduce circuit sensitivities due to thermal gradients and process variations, modules of the same symmetry group should be placed as close as possible to each other, and to help achieve this result, the invention employs the concept of a symmetry islands. A "symmetry island" is a placement of a symmetry group satisfying symmetry constraints on the symmetry group wherein each module in the group abuts at least one other module of the same group such that modules in the symmetry group form a connected placement. FIGS. 4 and 5 show two different placements for the same symmetry group $S = (b_1, b_1'), (b_2, b_2')$. The placement shown in FIG. 4 forms a symmetry island 14 in which modules $b_1, b_1', b_2$ and $b_2'$ abut one another, but the placement in FIG. 5 does not form a symmetry island since it results in two disconnected components 16 and 18. The placement style in FIG. 4 is usually preferable in analog layout design.

B*-Trees

A placement algorithm in accordance with the invention employs an improved from of a conventional binary tree ("B*-tree") to represent a compacted placement in which no module can move any further down or to the left. FIG. 2A shows a compacted placement of a set of 10 modules $b_0$-$b_9$ and FIG. B shows a corresponding B*-tree representation of that placement wherein every node $n_i$ of the B*-tree corresponds to a module $b_i$ of the compacted placement. The root $n_0$ of the B*-tree of FIG. 2B corresponds to the module $b_0$ on the bottom-left corner of the placement of FIG. 5A. For each node $n_i$ corresponding to a module $b_i$, the left child of node $n_i$ represents the lowest, adjacent module on the right side of module $b_i$, while the right child of node $n_i$ represents the first module above $b_i$ having the same horizontal coordinate.

Given a B*-tree representation of a compacted placement, a placement tool can calculate the coordinate ($x_i$, $y_i$) of each module by a pre-order tree traversal. Suppose the module $b_i$, represented by the node $n_i$, has the bottom-left coordinate ($x_i$, $y_i$), width $w_i$, and height $h_i$. Then for the left child, $n_j$, of $n_i$, $x_j=x_i+w_i$; for the right child, $n_k$, of $n_i$, $x_k=x_i$. A placement tool in accordance with the invention maintains a contour structure to calculate y-coordinates. Thus, starting from the root node, whose bottom-left coordinate is (0, 0), then visiting the root's left subtree, and then its right subtree, the tool can use a pre-order tree traversal procedure (B*-tree packing) to calculate all coordinates of the modules in the placement. A B*-tree is a convenient way for a placement tool to represent a compacted placement and allows a placement tool to quickly modify a placement by modifying its B*tree representation and to quickly evaluate various aspects of a placement by processing its B*-tree representation.

ASF-B*-Trees

A placement tool in accordance with the invention employs an improved form of a B*-tree, hereinafter called an automatically symmetric-feasible B*-tree ("ASF-B*-tree") to represent a layout for a symmetry island. A conventional B*-tree representation of a placement includes a separate node $n_i$, $n_i'$ or $n_i^s$ representing each module $b_i$, $b_i'$ or $b_i^s$ of an IC. An ASF-B*-tree representation of a symmetry island includes only "representative nodes" $n_i^r$ corresponding to "representative modules" $b_i^r$ of the IC. In order to construct an ASF-B*-tree representation of a symmetry island, it is necessary to first establish a representative module for each symmetry group or self-symmetry module that is subject to a symmetry constraint and for each "symmetrically unconstrained" module that is not subject to a symmetry constraint.

1. The representative module $b_j^r$ for a symmetry pair ($b_j$, $b_j'$) in a 1D symmetric placement is $b_j'$ and is the upper half of $b_j'$ in a 2D placement.

2. The representative module $b_k^r$ of a self-symmetry module $b_k^s$ is the right half of $b_k^r$ in a 1D symmetric placement or the top-right quarter of $b_k^r$ in a 2D symmetric placement.

Figure 6A:
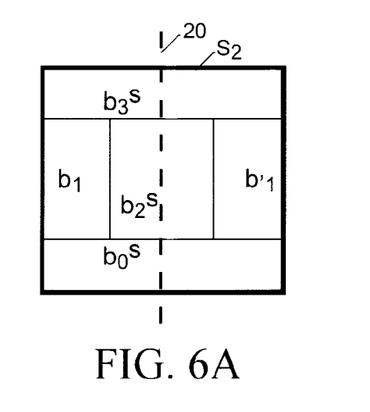
FIG. 6A illustrates an IC placement for a one-dimensional symmetry island.
Figure 6B:
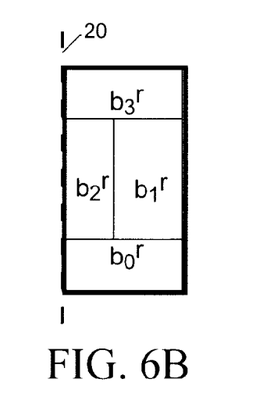
FIG. 6B illustrates an IC placement for representative modules of the symmetry island of FIG. 6B.
Figure 6C:
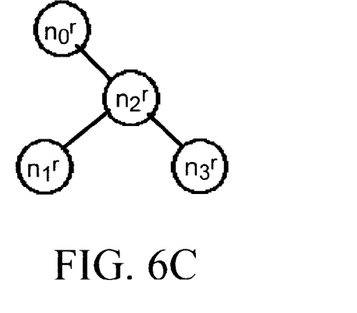
FIG. 6C illustrates an ASF-B*-tree representation of the placement of FIG. 6A.

FIG. 6A shows a 1D symmetric placement for a symmetry island $S_2$ that is symmetric about a vertical axis 20, FIG. 6B shows a corresponding placement for only the representative modules for the symmetry group of FIG. 6A, and FIG. 6C shows a corresponding ASF-B* tree representation of the placement of FIG. 6A. The symmetry axis of a symmetry group in a 1D symmetric placement can be either vertical or horizontal. In FIGS. 6A-6C, the modules in the symmetry island $S=\{(b_1, b'_1), b^s_0, b^s_2, b^s_3\}$ are placed symmetrically with respect to its vertical axis 20. To construct the corresponding ASF-B*-tree, the placement tool selects the representative module of each symmetry pair and self-symmetry module and considers the placement on the right-half plane. FIG. 6B shows the representative modules, and FIG. 6C shows ASF-B*-tree corresponding to the symmetric placement wherein each node in the ASF-B*-tree corresponds to a representative module.

Figure 7A:
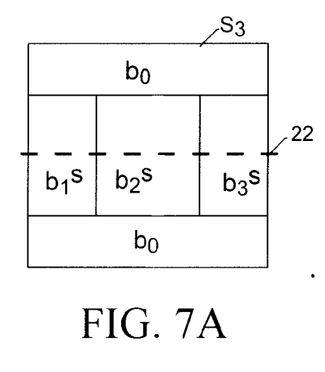
FIG. 7A illustrates an IC placement for a one-dimensional symmetry island.
Figure 7B:
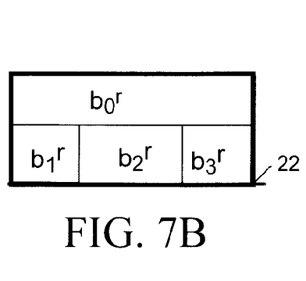
FIG. 7B illustrates an IC placement for representative modules of the symmetry island of FIG. 7B.
Figure 7C:
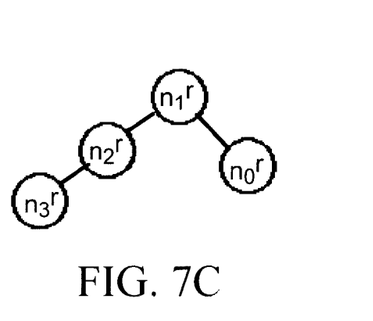
FIG. 7C illustrates an ASF-B*-tree representation of the placement of FIG. 7A.
Figure 8A:
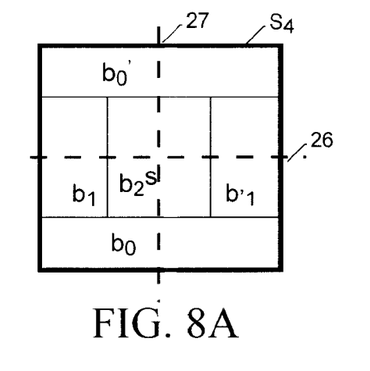
FIG. 8A illustrates an IC placement for a two-dimensional symmetry island.
Figure 8B:
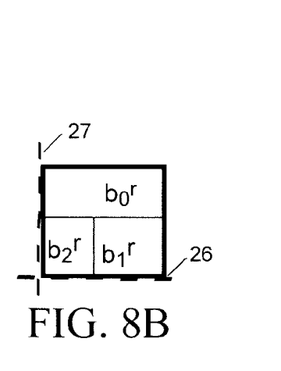
FIG. 8B illustrates an IC placement for representative modules of the symmetry island of FIG. 8B.
Figure 8C:
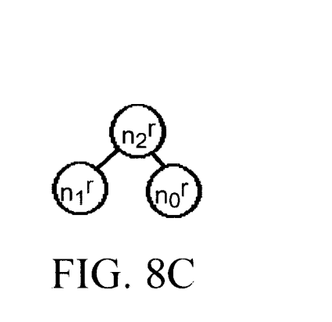
FIG. 8C illustrates an ASF-B*-tree representation of the placement of FIG.

FIG. 7A shows a 1D symmetric placement for a symmetry group $S_3$ that is symmetric about a horizontal axis 22, FIG. 7B shows a corresponding placement for only the representative modules for the symmetry group of FIG. 7A, and FIG. 7C shows a corresponding ASF-B* tree representation of the placement of FIG. 7A. FIG. 8A shows a 2D symmetric placement for a symmetry group $S_4$ that is symmetric about horizontal and vertical axes 26 and 27, FIG. 8B shows a corresponding placement for only the representative modules for the symmetry group of FIG. 8A, and FIG. 8C shows a corresponding ASF-B* tree representation of the placement of FIG. 8A.

Since each symmetry pair or self-symmetry module has its own representative module, the number of the nodes in an ASF-B*tree representation of a symmetry island should be the same as the number of symmetry pairs and self-symmetry modules in the symmetry island. Once a placement tool has generated an ASF-B*-tree for a packed symmetry island, it can obtain the coordinates of these representatives the coordinates of their symmetric modules based on equations in Group (1), (2), (3), or (4) above with the given coordinates of the symmetry axes, ($\hat{x}_i, \hat{y}_i$). These coordinates can act as a guide for placement of a symmetry island.

In a 1D symmetric placement, the representative of a self-symmetry module abuts the symmetry axis. Let S be a symmetry group with 1D vertical symmetric placement, and $b^s$ be a self-symmetry module in S. The symmetry axis of S is denoted by $\hat{x}$, and the center of $b^s$ is denoted by ($x^s$, $y^s$). In 1D vertical symmetry, the symmetry axis $\hat{x}$ always passes through the center ($x^s$, $y^s$) of the self-symmetry module $b^s$, i.e. $\hat{x}=x^s$. According to Definition 2, the representative $b^r$ of $b^s$ is the right half of $b^s$. Therefore, the center ($x^s$, $y^s$) of $b^s$ must be on the left boundary of $b^r$. To keep the symmetric-feasible condition $\hat{x}=x^s$, $b_r$ must abut the symmetry axis $\hat{x}$. The case for 1D horizontal symmetry can be proved similarly.

In a 1D symmetric placement, the representative of a symmetry pair is always symmetric-feasible. Let S be a symmetry group with 1D vertical symmetric placement, and (b, b') be a symmetry pair in S. The symmetry-axis of S is denoted by $\hat{x}$, and the centers of b and b' are (x, y) and (x', y'). The representative of the symmetry pair (b, b') is b'. In 1D vertical symmetry, given the coordinate of the representative b' and the symmetry axis $\hat{x}$, the coordinate of the symmetric module can be calculated by the equations $2\hat{x}=x+x'$ and $y=y'$. Therefore, the symmetric-feasible condition is always satisfied. The case for 1D horizontal symmetry is similarly shown.

The left-boundary (or right-boundary) constraint for 1D vertical (or horizontal) symmetric placement: the representative node of a self-symmetry module should always be on the right-most (or left-most) branch of the ASF-B*-tree. The nodes representing the modules on the left boundary should be on the rightmost branch as shown in FIG. 6C. Similarly, we can derive the ASF-B*-tree of the symmetric placement when the symmetry axis is in the horizontal direction. In this case, we only consider the top-half plane during the placement of the representative modules. FIG. 7C shows the ASF-B*-tree of the symmetry island $S_3=\{(b_0, b_0'), b_1^s, b_2^s, b_3^s\}$ having symmetric placement with respect to the horizontal symmetry axis 22 in FIG. 7A. Again, the representatives of the self-symmetry modules should abut the horizontal symmetry axis, which is on the bottom boundary of the top-half plane. Therefore, the nodes representing the modules on the bottom boundary should be on the leftmost branch, as illustrated FIG. 7C.

The placement tool also represents the 2D symmetric placement of a symmetry island using the ASF-B*-tree. FIG. 8A shows the 2D symmetric placement of the symmetry group S={($b_0$, $b_0$'), ($b_1$, $b_1$'), $b_2^s$}, where modules $b_0$ and $b_0$' are placed symmetrically along the horizontal symmetry axis 26, modules $b_1$ and $b_1$' are placed symmetrically along the vertical symmetry axis 27, and module $b_2$ is self-symmetric on both axes. For the 2D symmetric placement, we need only consider the top right quarter of the plane and select a representative module for each symmetry pair and self-symmetry module, as shown in FIG. 8B FIG. 8C shows the corresponding ASF-B*-tree.

In a 2D symmetric placement, the representative of a self-symmetry module must abut both symmetry axes. Let S be a symmetry group with 2D symmetric placement, and $b^s$ be a self-symmetry module in S. The symmetry axes of S is denoted by $x^\wedge$ and $y^\wedge$, and the center of $b^s$ is denoted by ($x^s$, $y^s$). In 2D symmetry, both symmetry axes $x^\wedge$ and $y^\wedge$ must pass through the center ($x^s$, $y^s$) of the self-symmetry module $b^s$, i.e. $x^\wedge=x^s$ and $y^\wedge=y^s$. According to Definition 2, the representative $b^r$ of $b^s$ is the top-right quarter of $b^s$. Therefore, the center ($x^s$, $y^s$) of $b^s$ will be located on the bottom-left corner of $b^r$. To keep the symmetric-feasible condition $x^\wedge=x^s$ and $y^\wedge=y^s$, $b^r$ must abut both symmetry axes $x^\wedge$ and $y^\wedge$.

In a 2D symmetric placement, there is at most one self-symmetry module. The representative node of the self-symmetry module is the root node of the ASF-B*-tree. Both symmetry axes must pass through the center of the self-symmetry module, and since the modules cannot be overlapped, there is at most one self-symmetry module whose center is right on the symmetry axes. In a 2D symmetric placement, the representative of a symmetry pair must abut one of the symmetry axes. Let S be a symmetry group with 2D symmetric placement, and (b, b') be a symmetry pair in S. The symmetry axes of S are denoted by $x^\wedge$ and $y^\wedge$, and the centers of b and b are denoted by (x, y) and (x', y'), respectively. In 2D symmetry, there is exactly one of the symmetry axes $x^\wedge$ and $y^\wedge$ passing through the centers (x, y) and (x', y') of the symmetry pair (b, b'), i.e. $x^\wedge=x=x'$ or $y^\wedge=y=y'$. We first consider the case $x^\wedge=x=x'$. According to Definition 2, the representative $b^r$ of (b, b') is the right half of b'. Therefore, the center (x', y') of b' must be on the left boundary of $b^r$. To keep the symmetric-feasible condition $x^\wedge=x'$, $b^r$ must abut the symmetry axes x. The proof of $y^\wedge=y=y'$ is similar.

There are three kinds of the boundary constraints for a 2D symmetric placement:

1) Left-boundary constraint: For the symmetry pair ($b_0$, $b_0$') whose centers ($x_0$, $y_0$) and ($x'_0$, $y'_0$) lie on the vertical symmetry axis, the representative node $b_0^r$ is on the rightmost branch of the ASF-B*-tree.

2) Bottom-boundary constraint: For the symmetry pair ($b_1$, $b_1$') whose centers ($x_1$, $y_1$) and ($x_1'$, $y_1'$) lie on the horizontal symmetry axis, the representative node $b_1^r$ is on the left-most branch of the ASF-B*-tree.

3) Corner constraint: For the self-symmetry module $b_2^s$ whose center ($x_2$, $y_2$) lie on both symmetry axes, the representative node is the root node of the ASF-B*-tree.

As shown in FIG. 5B, the representative $b_0^r$ of the symmetry pair ($b_0$, $b_0$') abuts the vertical symmetry axis at the left boundary, and thus the corresponding node $n_0^r$ is on the right-most branch of the ASF-B*-tree. Also, the representative $b_1^r$ of the symmetry pair ($b_1$, $b_1$') abuts the horizontal symmetry axis at the bottom boundary, and thus the corresponding node $n_1^r$ is on the leftmost branch of the ASF-B*-tree. The representative $b_2^r$ of the self-symmetry module $b_2^s$ abuts both symmetry axes at the corner, and thus the corresponding node $n_2^r$ is the root of the ASF-B*-tree.

An ASF-B*-tree is symmetric-feasible in both 1D and 2D symmetric placements since all the representatives in the ASF-B*-tree are symmetric-feasible. There are four kinds of representatives, and the symmetric-feasible condition for each is proven above. Therefore, an ASF-B*-tree is symmetric-feasible in both 1D and 2D symmetric placements.

All representative modules of a symmetry group will form a connected placement (a symmetry island) after packing. We set the coordinate(s) of the symmetry axis (axes) to the left or (and) the bottom boundary (boundaries) of the connected placement of the representative modules. The coordinates of the symmetric modules can be calculated by the equations in Group (1), (2), (3), or (4). The symmetric modules also form a connected placement, and the boundary of the connected placement also abuts the symmetry axis (axes). Therefore, the entire symmetry group forms a connected placement, and each module in the group abuts at least one of the other modules in the same group. The packing of an ASF-B*-tree thus results in a symmetry island of the corresponding symmetry group.

After obtaining the placement of the representative modules, we simply get the mirrored placement of the symmetric ones that is also unique. Therefore, there is a unique correspondence between an admissible placement for a symmetry island and its ASF-B*-tree. Thus a placement tool can efficiently find a correct symmetric placement for a symmetry island represented by an ASF-B*-tree because it can avoid searching redundant solution spaces.

Hierarchical B*-Tree

The invention uses a hierarchical B*-tree ("HB*-tree") to simultaneously place modules in symmetry islands and non-symmetry modules. In an HB*-tree, the symmetry island of each symmetry group can be in any rectilinear shape, and symmetry and non-symmetry modules are simultaneously placed to optimize the placement.

Figure 9:
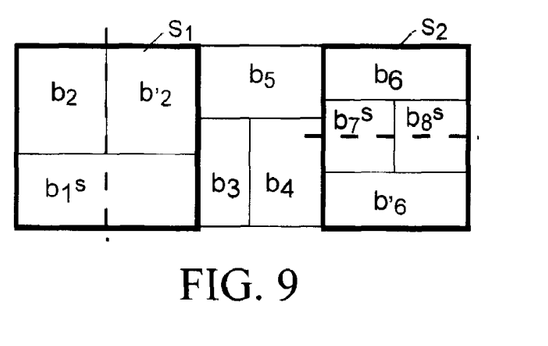
FIG. 9 illustrates an IC placement for a collection of modules including two symmetry islands.
Figure 10A:
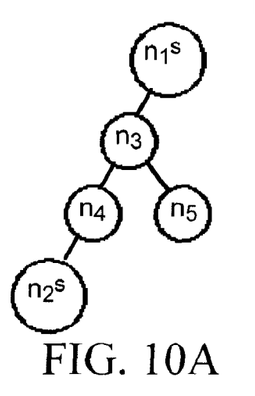
FIGS. 10A-10C illustrate an HB*-tree representation the placement in FIG. 9.
Figure 10B:
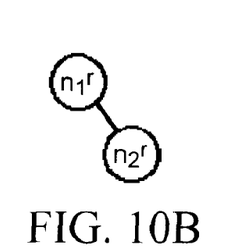
Figure 10C:
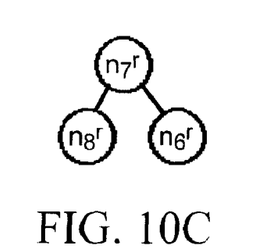

FIG. 9 illustrates a placement including two symmetry islands $S_1$ and $S_2$ along with three other modules $b_3$, $b_4$, $b_5$. FIGS. 10A-10C illustrate an HB*-tree for the placement in FIG. 9 wherein each of two hierarchical nodes, $n_1^s$ and $n_2^s$ represent separate ASF-B*-trees FIG. 10B and FIG. 10C that in turn represent symmetry islands $S_1$ and $S_2$. FIG. 10A shows the HB*-tree representing the placement of FIG. 9. FIG. 10B shows the AFS-B*-tree corresponding to hierarchical node $n_1^s$ of FIG. 10A and representing the placement of symmetry island $S_1$ of FIG. 9, and FIG. 10C shows the AFS-B*-tree corresponding to hierarchical node $n_2^s$ of FIG. 10A and representing the placement of symmetry island $S_2$ of FIG. 9. Nodes node $n_1^s$ and $n_2^s$ are "hierarchical" in the sense that each represents a lower order AFS-B*-tree.

Figure 11:
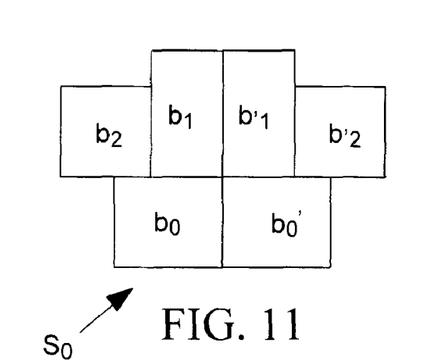
FIG. 11 Illustrates an IC placement for a symmetry group.
Figure 12:
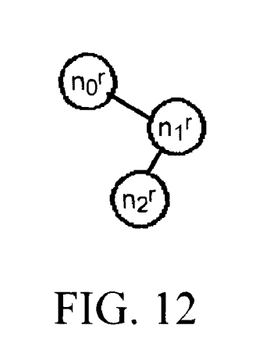
FIG. 12 illustrates an AFS-B*-tree for the placement of FIG. 11.
Figure 13:
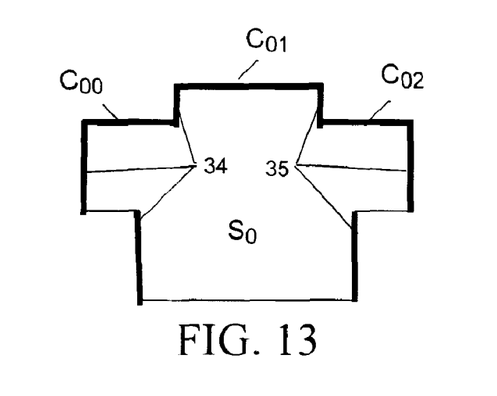
FIG. 13 Illustrates an IC placement for a symmetry group.
Figure 14:
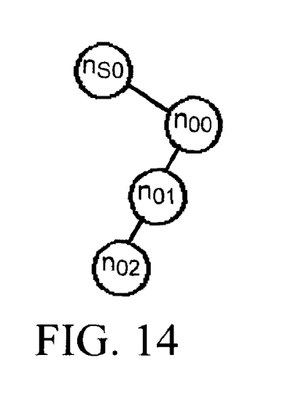
FIG. 14 illustrates an AFS-B*-tree for the placement of FIG. 13.

Although symmetry islands are always rectilinear in shape they are often non-rectangular as, for example, is the case for symmetry island of FIG. 11. Since a non-rectangular symmetry island has more than four sides, it is necessary for the placement tool to augment an HB*-tree representing a non-rectangular symmetry island in order to use it to define the relative positions of all modules. FIG. 12 shows an AFS-B*tree for the placement of symmetric modules forming the symmetry island $S_0$ of FIG. 11. FIG. 14 shows an augmented HB*-tree representation of $S_0$, which includes a hierarchical node $n_0^s$ representing the ASF-B*-tree of FIG. 12 as well as three "contour nodes" $n_{00}$, $n_{01}$, and $n_{02}$ representing the symmetry island's three top horizontal contour segments $C_{00}$, $C_{01}$, and $C_{02}$ of symmetry island $S_0$ as illustrated in FIG. 13. Each contour node retains the coordinates of the corresponding horizontal contour segment.

Properties for an HB*-Tree.

1) The left child of a hierarchy node, if any, must be a non-contour node.

2) The right child of a hierarchy node must be the contour node representing the left-most horizontal contour segment of the symmetry island.

3) The left child of a contour node, if any, must be the contour node representing the next contour segment on the right side.

4) The right child of a contour node, if any, must be a non-contour node.

5) The children of a regular module node must be non-contour nodes.

6) The parent of a contour node cannot be a regular module node.

7) The parent of a regular module or a hierarchy node can be any other node.

HB*-Tree Packing

Before packing an HB*-tree, the placement tool packs the ASF-B*-tree for each hierarchical node representing a symmetry island to obtain the outline of the symmetry island. The placement tool then stores data indicating the symmetry island's vertical and horizontal contours in the corresponding hierarchy node. While packing a hierarchical node representing a symmetry island, the placement tool calculates the best packing coordinate for the bottom boundary of the symmetry island, based on the effective two (dual) vertical contours 34 and 35 shown in FIG. 13. After packing the left child of the hierarchy node and all its descendants are packed, the placement tool packs the first contour node of the symmetry island, followed by the second one, and so on. When packing the contour nodes, the placement tool need only update their coordinates and replace the hierarchy node in the contour data structure of the HB*-tree.

Figure 15A:
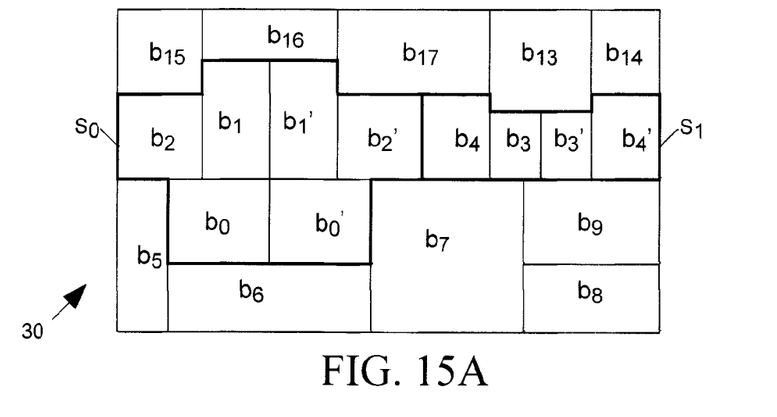
FIGS. 15A and 15B illustrate an IC placement including two symmetry islands.
Figure 15B:
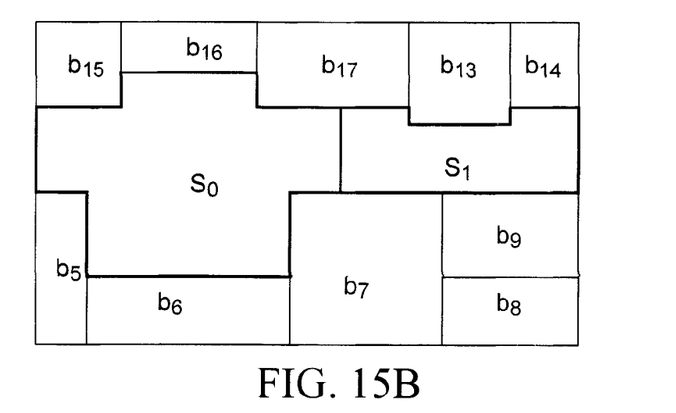
Figures 15C, 15D, 15E:
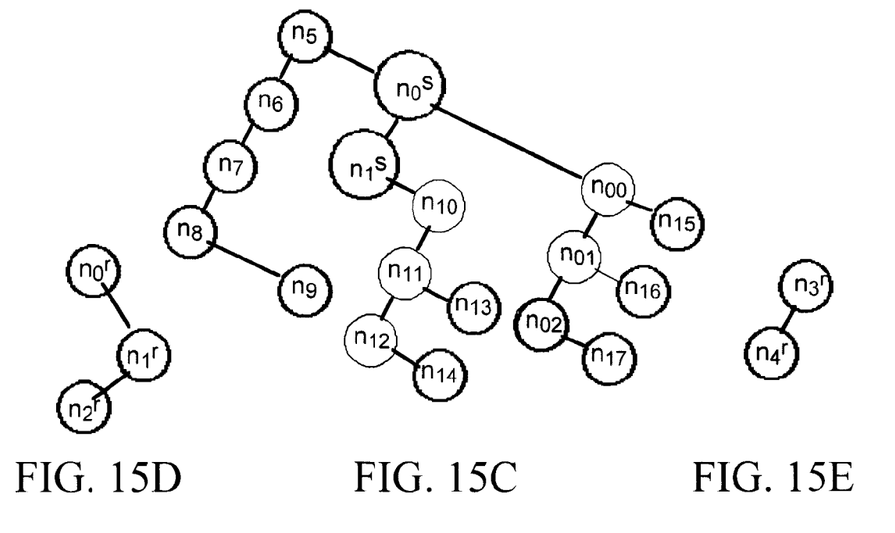
FIGS. 15C-15E illustrate an AFS-B*-tree representation of the placement of FIG. 15B.

FIGS. 15A and 15B show a placement 30 for a set of modules including two non-rectangular symmetry islands $S_0$ and $S_1$. The placement tool first packs the two ASF-B*-trees in $n_0^s$ and $n_1^s$ and obtains the outlines of the two rectilinear symmetry islands. The placement tool then packs nodes $n_5$, $n_6$, $n_7$, $n_8$, $n_9$ to obtain a temporal contour list $<n_5, n_6, n_7, n_9>$. By calculating rectilinear outlines between the temporal contour list and the bottom boundary of the symmetry island $S_0$, the placement tool minimizes dead space between the previously packed modules and the symmetry island to obtain an updated temporal contour list $<n_0^S, n_7, n_9>$. Continuing the packing procedure, the placement tool obtains the resulting placement. FIG. 15C illustrates the corresponding HB*-tree, with nodes $n_0^s$ and $n_1^s$ corresponding to symmetry islands $S_0$ and $S_1$ representing the ASF*-B-trees of FIGS. 15D and 15E, respectively.

Simulated Annealing

The placement algorithm employed by the placement tool is based on simulated annealing. Given an initial placement solution represented by an HB*-tree, the placement tool perturbs it to search for a "good" configuration satisfying a termination condition defined by a cost function. A suitable cost function, Ö(P), of the placement is defined in Equation [1], where α and β are user-specified parameters, AP is the area of the bounding rectangle for the placement, and WP is the half-perimeter wire length (HPWL).

$$Ö(P) = \alpha \times AP + \beta \times WP.$$ [1]

The placement tool can apply the following operations to perturb an ASF-B*-tree.

Op1: Rotate a module.
Op2: Reposition a node.
Op3: Swap two nodes.
Op4: Change a representative.
Op5: Convert a symmetry type.

Op1, Op2 and Op3 are employed in prior art non-hierarchal, B*-tree based systems that employ simulated annealing. In a system in accordance with the invention that employs a hierarchical HB*-tree representation, non-hierarchy nodes have higher probabilities to be selected for perturbation because rotating, moving or swapping a hierarchical node can produce a large change from one solution to the next than a similar change to a non-hierarchal node and because large changes between successive solutions can deteriorate solution quality during the simulated annealing process. Due to the special structure of the HB*-tree, the placement tool cannot move a non-hierarchy node to the right child of a hierarchy node or to the left child of a contour node. The placement tool always moves contour nodes with their hierarchy node.

Perturbations Op4 and Op5 are added in the hierarchical, ASF-B*-tree based system employed by the present invention. The placement tool can change a representative (Op4) of a symmetry pair or a self-symmetry module to optimize wire length without changing symmetry island area. There are four representative change cases:

Case 1: Change a representative of a symmetry pair in a 1D symmetric placement.
Case 2: Change a representative of a symmetry pair in a 2D symmetric placement.
Case 3: Change a representative of a self-symmetry module in 1D symmetric placement.
Case 4: Change a representative of a self-symmetry module in 2D symmetric placement.

In Case 1, for a symmetry pair $(b_i, b_i')$, the placement tool can simply change the representative from $b_i$ to $b_i'$ or from $b_i'$ to $b_i$. In Case 2, there are four representatives for a symmetry pair, and two representatives for each module. The placement tool changes the representative from one in the current module to one of the representatives in the other module of the symmetry pair. For Cases 3 and 4, changing the representative of a self-symmetry module is similar to the operation of rotation or flip.

There are six a symmetry type conversion cases (Op5):
Case 1: 1D vertical to horizontal symmetry.
Case 2: 1D horizontal to vertical symmetry.
Case 3: 1D vertical symmetry to 2D symmetry.
Case 4: 1D horizontal symmetry to 2D symmetry.
Case 5: 2D symmetry to 1D vertical symmetry.
Case 6: 2D symmetry to 1D horizontal symmetry.

Figure 16A:
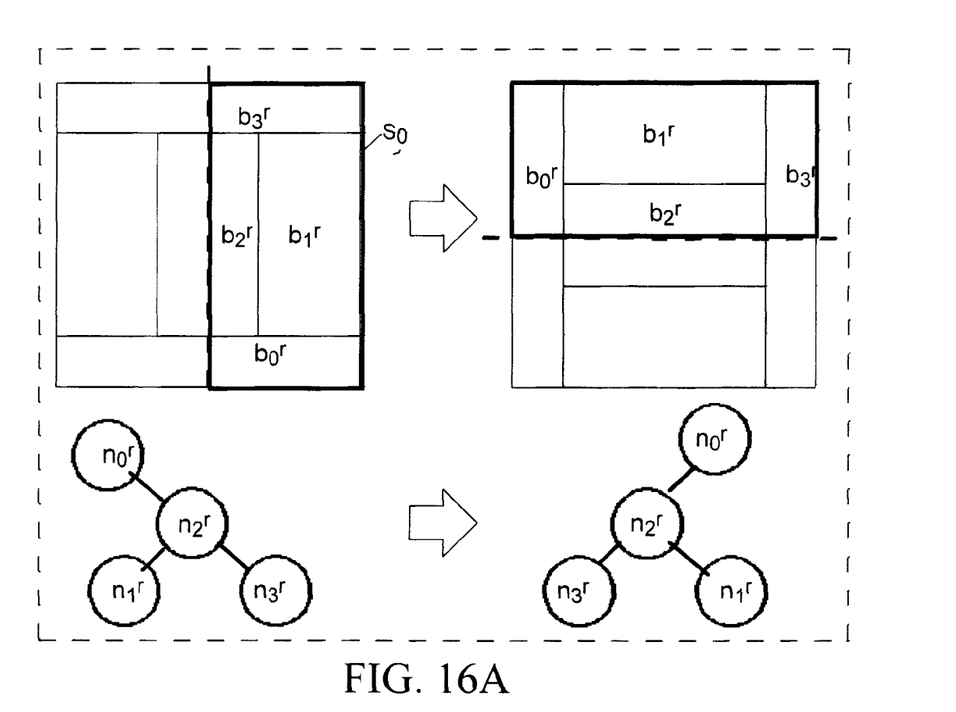
FIGS. 16A and 16B each illustrate IC placement for representative modules of a symmetry island a rotated version of the symmetry island, and their corresponding HB*-tree representations.
Figure 16B:
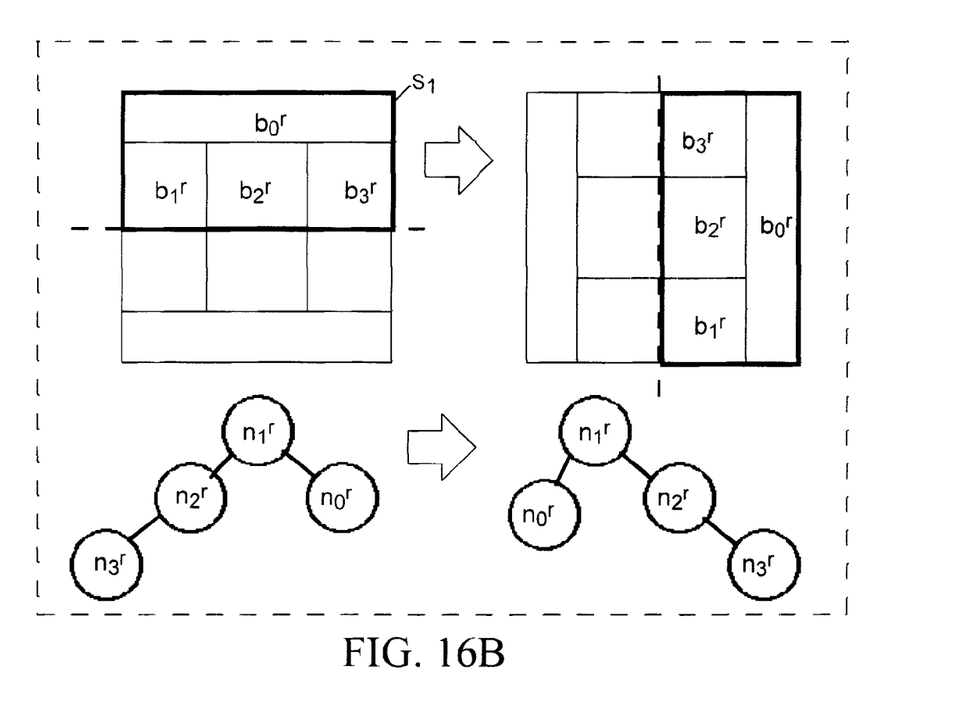

For Cases 1 and 2, to convert the symmetric placement between two 1D symmetry types, the placement tool rotates each module and then swaps the left and the right children of each node. FIG. 16A shows example of Case 1, where a symmetry island $S_0$ having vertical symmetry is rotated so that it has horizontal symmetry, and FIG. 16B shows an example of Case 2, wherein a symmetry island $S_1$ having horizontal symmetry is rotated so that it exhibits vertical symmetry. FIGS. 16A and 16B also show the corresponding changes to the ASF-B*-tree representations of the symmetry islands For Cases 3 and 4, the placement tool first determines whether there is only one self-symmetry module. To convert the symmetric placement from 1D symmetry to 2D symmetry, the placement tool re-determines the representative of each symmetry pair and self-symmetry module and then rebuilds the ASF-B*-tree.

Figure 17A:
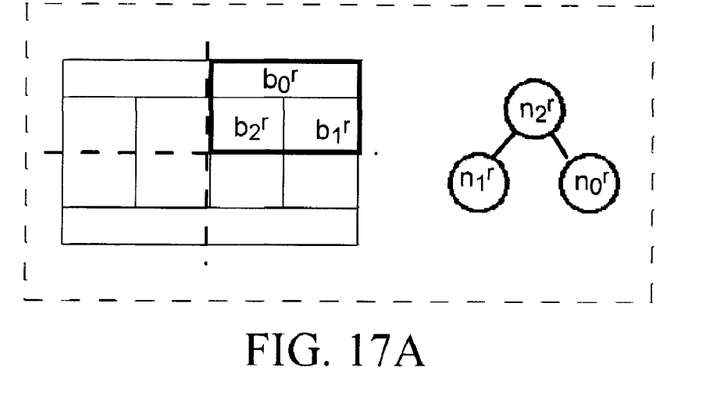
FIGS. 17A-17C each illustrate representative module placements for a symmetry island and their corresponding HB*-tree representations

In Cases 5 and 6, to convert the symmetric placement from 2D symmetry to 1D symmetry type, the placement tool tries to keep the tree structure while updating each representative for the converted symmetry type. FIG. 17A shows an example 2D symmetric placement, which can be converted to a 1D vertical symmetry placement as shown in FIG. 17B or to a 1D horizontal symmetry placement shown in FIG. 17C.

Figure 17B:
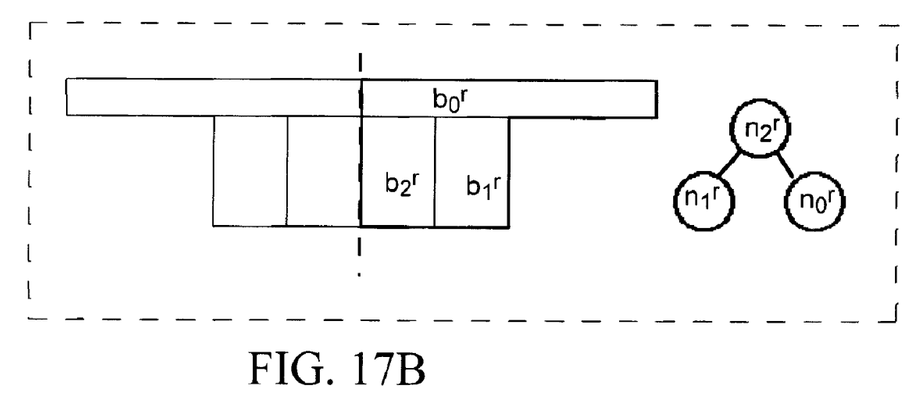
Figure 17C:
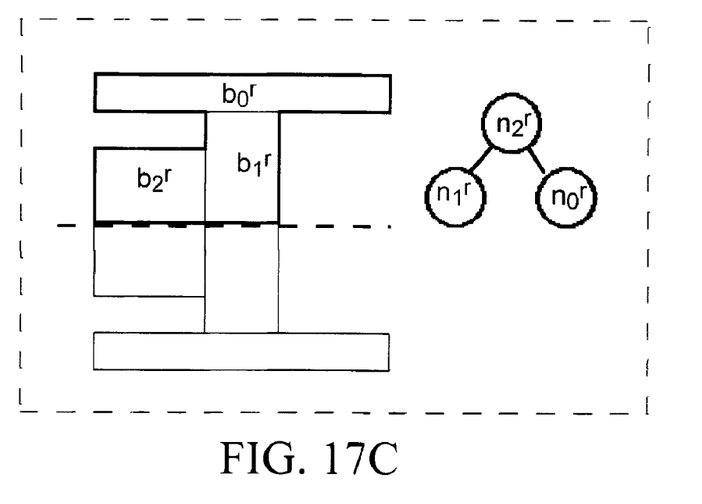

Although the topology of corresponding HB-tree representation as shown in each FIG. 17A-17C does not change, the stored contour information does change as a result of Case 5 and 6 conversions. When an ASF-B*-tree is perturbed, the number of the corresponding contour nodes in the HB*-tree can change and the placement tool may have to update the tree structure accordingly. When the number of contour nodes representing the horizontal contour segments of the symmetry island increases, the structure of the HB*-tree remains unchanged. However, if the number of contour nodes decreases, other nodes in the HB*-tree may not have parents, so the placement tool reassigns new parent nodes to such "dangling nodes". To keep the relative placement topology before and after perturbing an ASF-B*-tree, the placement tool first finds the nearest contour node for each dangling node. If the nearest contour node has no right child, it is the parent of the dangling node, and the dangling node will be its right child. If the nearest contour node has a right child, we continuously traverse the leftmost-skewed child of the right child. The leftmost-skewed child will be the parent of the dangling node, and the dangling node is assigned to its left child. It takes amortized constant time to update the contour related nodes.

Figure 18A:
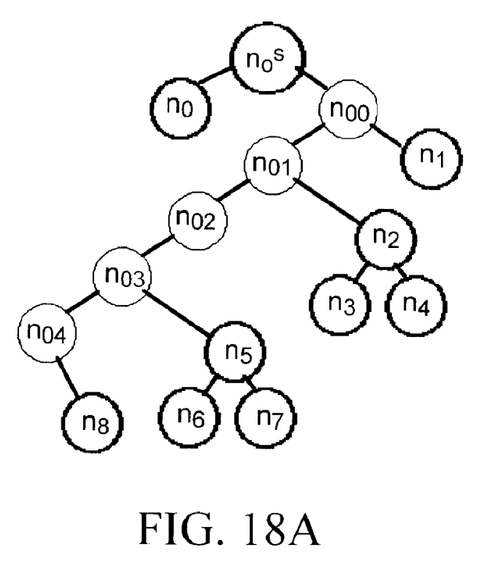
FIGS. 18A and 18B are HB*-tree placement representations.
Figure 18B:
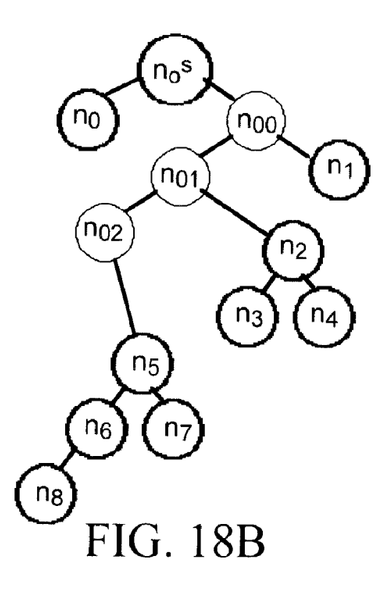

FIGS. 18A and 18B show an example of updating contour related nodes. Initially, there are five contour nodes $n_{00}$-$n_{04}$ in the HB*-tree of a symmetry group as shown in FIG. 18A, but after perturbing the ASF-B*-tree of the symmetry group, contour nodes $n_{03}$ and $n_{04}$ disappear, and nodes $n_5$ and $n_8$ become dangling nodes. The placement tool first finds the nearest contour node of $n_5$, which is $n_{02}$, and since $n_{02}$ has no right child, the placement tool simply designates $n_5$ as the right child and $n_{02}$ as the parent of $n_5$. The placement tool then searches the nearest contour node of $n_8$, which is also $n_{02}$. Since $n_{02}$ already has the right child $n_5$, the tool searches the most left-skewed child, which is $n_6$. The tool designates $n_6$ as the parent of $n_8$, and $n_8$ as the left child of $n_6$. FIG. 18B shows the result of the contour update.

Placement Algorithm

Figure 19:
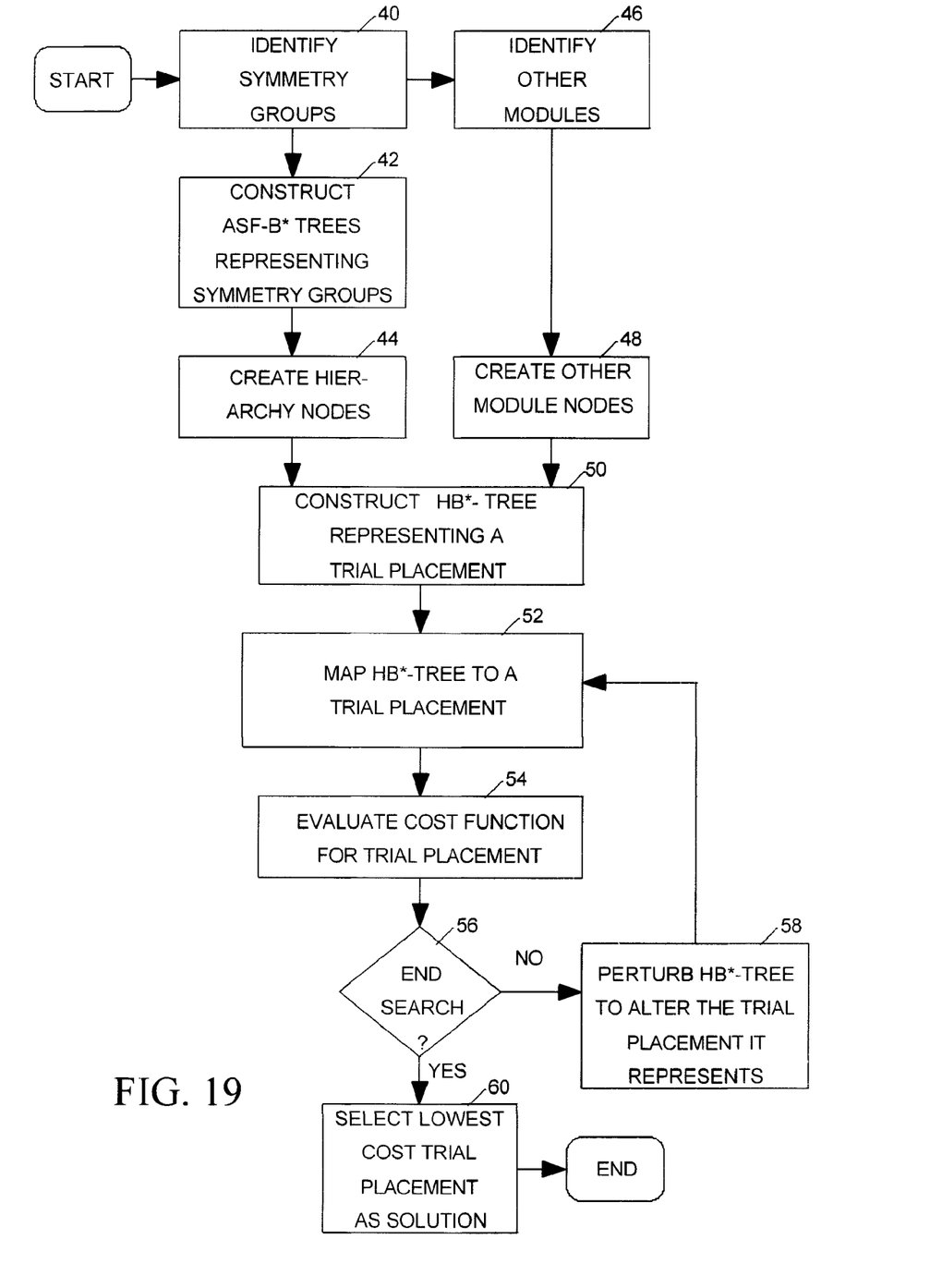
FIG. 19 is a data flow diagram illustrating a method in accordance with the invention.

FIG. 19 is a data flow diagram illustrating a method in accordance with the invention enabling a placement tool to optimize a placement of device modules within an IC layout for an IC described by a netlist. The method ensures that each symmetry group placement satisfies a set of symmetric placement constraints on the symmetry group and that each symmetry group forms a symmetry island wherein device elements form a connected placement. The method finds a placement that minimizes a value of a cost function that is a measure of the placement quality.

The placement tool initially identifies each symmetry group within the IC described by the netlist (step 40), either by receiving information from a user referencing the modules included in each symmetry group or by processing the netlist to automatically determine which modules are included in each symmetry group based on the nature of the modules and the manner in which the netlist indicates they are interconnected. The placement tool then constructs an packed AFS-B* tree as described above for each symmetry group (step 42) characterizing the symmetry group as a symmetry island satisfying all symmetry constraints placed on the symmetry group, and creates a hierarchical HB*-tree node to represent each symmetry island (step 44). The placement tool also identifies each module included in the netlist that is not a part of an identified symmetry group (step 46) and creates an HB*-tree node for each non-symmetry group module (step 48).

The placement tool then assembles all of the hierarchical and other nodes created at steps 44 and 48 into an HB*-tree representing a packed initial placement (step 50) in which all symmetry groups are symmetry islands satisfying symmetry constraints place on the symmetry groups. The placement tool then generates a placement based on that HB*-tree representation (step 52) and then evaluates the cost function for that placement (step 54). If the placement tool is not ready to end its search for a lowest cost placement (step 56), it perturbs the last generated HB*-tree (step 58) using any of the OP1-OP5 perturbations discussed above and then repeats steps 52-56, thereby evaluating the cost function for the placement represented by the perturbed HB*-tree.

The placement tool continues to loop through steps 52-58 iteratively perturbing the HB*-tree in various ways and evaluating the cost function for the resulting placement until at step 56 it decides to end its search and select the lowest cost placement it found as the final placement (step 60).

Thus has been shown and described a method in accordance with the invention that a placement tool can use to generate a placement for an analog IC. The method is advantageous because using AFS-B*-trees within a hierarchical HB*-tree representation of an IC placement to represent symmetry groups as symmetry islands allows a placement tool to find a low cost IC layout meeting all symmetric placement constraints with less processing time than a conventional placement using a non-hierarchal B*-tree representation of the IC. The method also insures that all modules forming each symmetry group are proximate to one another, thereby minimizing effects of parasitic mismatches and circuit sensitivity to thermal gradients or process variations.

The invention claimed is:

1. Non-transitory computer-readable media containing instructions, which when read and executed by a computer, causes the computer to execute a method for optimizing a placement for a plurality of device modules within an integrated circuit (IC) including at least one symmetry group formed by device modules that are subject to symmetric placement constraints relative to at least one axis of an area of the IC occupied by the symmetry group, wherein the method comprises the steps of:

a. iteratively perturbing a representation of a trial placement to produce a plurality of differing trial placement representations, each defining a position within the IC for each of the plurality of device modules, wherein each trial placement representation comprises a separate hierarchical element representing each symmetry group and defining a placement for the symmetry group that satisfies all symmetric placement constraints on the symmetry group, wherein at least one hierarchical element of each of the plurality of differing trial placement representations that represents a symmetry group defines a symmetry island in which all device modules of the symmetry group are arranged in a connected placement, and wherein each trial placement representation further comprises a separate element representing each device module not forming any symmetry group;

b. separately evaluating a cost function that is a measure of placement quality for each of the plurality of trial placements; and c. selecting one of the trial placements as the suitable placement in response to cost function evaluations carried out at step b.

2. The computer-readable media in accordance with claim 1 wherein a simulated annealing process is employed to determine how to obtain a good trial placement by perturbing the trial placement representations at step a.

3. The computer-readable media in accordance with claim 2 wherein each of the plurality of trial placement representations comprises a hierarchical B*-tree (HB*-tree) comprising a separate hierarchical node representing each symmetry group and a separate node representing each device module not forming any symmetry group.

4. The computer-readable media in accordance with claim 3 wherein each hierarchical node of the HB*-tree that represents a symmetry group comprises an automatically symmetric-feasible B*-tree (ASF-B*-tree) that defines a symmetry island within a trial placement comprising all of the device modules forming the symmetry group, wherein each device module of the symmetry island abuts at least one other device module of the symmetry island such that all device modules of the symmetry island form a connected placement.

5. The computer-readable media in accordance with claim 4
wherein at least one symmetry island defined by an ASF-B*-tree representing a symmetry group has one-dimensional ("1D") symmetry and nodes of the ASF-B*-tree represent portions of the symmetry group residing on only one side of an axis of the symmetry island, and
wherein at least one symmetry island represented by an ASF-B*-tree has two-dimensional ("2D") symmetry and nodes of the ASF-B*-tree represent only portions of the symmetry group residing in only one quadrant of the symmetry island.

6. The computer-readable media in accordance with claim 5
wherein the trial placement representation is altered during at least one iterative perturbation at step a by changing a manner in which an element representing at least one symmetry group defines a symmetry island,
wherein the trial placement representation is altered during at least one iterative perturbation of the trial placement representation at step a by changing a manner in which an element representing at least one symmetry group defines a symmetry island so as to alter relative positions of the device modules within the symmetry island,
wherein the trial placement representation is altered during at least one iterative perturbation of the trial placement representation at step a by changing a manner in which an element representing at least one symmetry group defines a symmetry island so as to alter a direction of an axis of symmetry of the symmetry island, and
wherein the trial placement representation is altered during at least one iterative perturbation of the trial placement representation at step a by changing a manner in which an element representing at least one symmetry group defines symmetry island so as to alter a number of axes of symmetry of the symmetry island.

7. The computer-readable media in accordance with claim 1 wherein each of the plurality of trial placement representations comprises a hierarchical B*-tree (HB*-tree) comprising a separate hierarchical node representing each symmetry group and a separate node representing each device module not forming any symmetry group.

8. The computer-readable media in accordance with claim 7 wherein each element of each of the plurality of trial placement representations that represents said symmetry group comprises an automatically symmetric-feasible B*-tree (ASF-B*-tree) that defines a symmetry island within a trial placement comprising all of the device modules forming the symmetry group.

9. The computer-readable media in accordance with claim 8
wherein at least one symmetry island defined by an ASF-B*-tree representing a symmetry group has one-dimensional ("1D") symmetry and nodes of the ASF-B*-tree represent portions of the symmetry group residing on only one side of an axis of the symmetry island.

10. The computer-readable media in accordance with claim 9
wherein at least one symmetry island represented by an ASF-B*-tree has two-dimensional ("2D") symmetry and nodes of the ASF-B*-tree represent only portions of the symmetry group residing in only one quadrant of the symmetry island.

11. The computer-readable media in accordance with claim 7, wherein some nodes in the HB*-tree represent symmetry island edges.

12. The computer-readable media in accordance with claim 1
wherein the IC includes nets interconnecting the device modules, and
wherein the value of the cost function relative to each trial placement is a function of an estimated length of the nets required to interconnected device modules placed in accordance with the trial placement.

13. The computer-readable media in accordance with claim 12, wherein the value of the cost function relative to each trial placement is also a function of an amount of area of the IC occupied by the device modules placed in accordance with the trial placement.

14. The computer-readable media in accordance with claim 1 wherein the trial placement representation is altered during at least one iterative perturbation at step a by changing a manner in which said one hierarchical element defines said symmetry island.

15. The computer-readable media in accordance with claim 1 wherein the trial placement representation is altered during at least one iterative perturbation of the trial placement representation at step a by changing a manner in which said one hierarchical element defines said symmetry island so as to alter relative positions of the device modules within the symmetry island.

16. The computer-readable media in accordance with claim 1 wherein the trial placement representation is altered during at least one iterative perturbation of the trial placement representation at step a by changing a manner in which said one hierarchical element defines said symmetry island so as to alter a direction of an axis of symmetry of the symmetry island.

17. The computer-readable media in accordance with claim 1 wherein the trial placement representation is altered during at least one iterative perturbation of the trial placement representation at step a by changing a manner in which said one hierarchical element defines said symmetry island so as to alter a number of axes of symmetry of the symmetry island.

* * * * *